(12) United States Patent
Goel et al.

(10) Patent No.: US 10,078,720 B2
(45) Date of Patent: Sep. 18, 2018

(54) METHODS AND SYSTEMS FOR CIRCUIT FAULT DIAGNOSIS

(71) Applicant: Taiwan Semiconductor Manufacturing Company Limited, Hsinchu (TW)

(72) Inventors: Sandeep Kumar Goel, Dublin, CA (US); Zipeng Li, Stanford, CA (US); Yun-Han Lee, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 614 days.

(21) Appl. No.: 14/656,834

(22) Filed: Mar. 13, 2015

(65) Prior Publication Data
US 2016/0267216 A1    Sep. 15, 2016

(51) Int. Cl.
*G01R 31/3183*   (2006.01)
*G01R 31/317*    (2006.01)
*G06F 17/50*     (2006.01)

(52) U.S. Cl.
CPC ... *G06F 17/5081* (2013.01); *G01R 31/31835* (2013.01); *G01R 31/318342* (2013.01); *G01R 31/3183* (2013.01); *G01R 31/31704* (2013.01); *G01R 31/318307* (2013.01)

(58) Field of Classification Search
CPC ...... G01R 31/318342; G01R 31/31835; G01R 31/31813
See application file for complete search history.

(56) References Cited

U.S. PATENT DOCUMENTS

| | | | |
|---|---|---|---|
| 2003/0014703 A1* | 1/2003 | Chakravarthy | ............................ G01R 31/318307 714/726 |
| 2003/0154432 A1* | 8/2003 | Scott | ............ G01R 31/318385 714/724 |
| 2004/0034495 A1* | 2/2004 | Marlett | ............ G01R 31/31835 702/117 |
| 2005/0132254 A1* | 6/2005 | Shiota | .............. G01R 31/31835 714/30 |
| 2006/0053357 A1* | 3/2006 | Rajski | .................... G01R 31/01 714/742 |
| 2006/0123288 A1* | 6/2006 | Luk | .................... G01R 31/3183 714/724 |
| 2007/0136700 A1* | 6/2007 | Wang | ............... G01R 31/31704 716/112 |
| 2008/0115029 A1* | 5/2008 | Kusko | ............ G01R 31/318342 714/742 |

* cited by examiner

*Primary Examiner* — Vuthe Siek
*Assistant Examiner* — Aric Lin
(74) *Attorney, Agent, or Firm* — Jones Day

(57) ABSTRACT

Systems and methods for circuit fault diagnosis are provided. An original circuit design is evaluated to determine whether the original circuit design is to be modified based at least in part on one or more first faults. In response to the original circuit design being determined not to be modified based at least in part on the one or more first faults, a first test pattern set is automatically generated based at least in part on the original circuit design. The original circuit design is evaluated to determine whether the original circuit design is to be modified based at least in part on the first test pattern set. In response to the original circuit design being determined not to be modified based at least in part on the first test pattern set, fault testing is performed to determine whether the original circuit design fails.

20 Claims, 10 Drawing Sheets

METHODS AND SYSTEMS FOR CIRCUIT FAULT DIAGNOSIS

BACKGROUND

The technology described in this disclosure relates generally to integrated circuits and more particularly to integrated circuit design.

A defect is an error caused in a circuit during a manufacturing process. A fault model is a mathematical description of how a defect alters circuit design behavior. For example, in a stuck-at fault model, a signal (e.g., a gate output) is stuck at a 0 or 1 value, independent of the inputs to the circuit. The logic values observed at primary outputs of a circuit, while applying a test pattern (e.g., a sequence of input signals) to some devices under test (DUT), are called the output of that test pattern. The output of a test pattern, when testing a fault-free circuit that works exactly as designed, is called the expected output of that test pattern. A fault is detected by a test pattern if the output of that test pattern, when testing a circuit that has only that one fault, is different than the expected output.

Automatic Test Pattern Generation (ATPG) includes an electronic design automation method/technology used to find a test pattern that, when applied to a circuit, enables automatic test equipment to distinguish between correct circuit behavior and faulty circuit behavior caused by defects. For example, the generated test patterns are used to test manufactured circuits, and in some cases to assist with failure analysis. The effectiveness of ATPG is measured by the amount of modeled defects, or fault models, that are detected and the number of generated test patterns. These metrics generally indicate test quality (e.g., higher with more fault detections) and test application time (e.g., higher with more test patterns). The ATPG efficiency is usually influenced by the fault model under consideration, the type of circuit under test (e.g., full scan, synchronous sequential, or asynchronous sequential), the level of abstraction used to represent the circuit under test (e.g., gate, register-transfer, switch), and the required test quality.

The ATPG process for a targeted fault includes two phases: fault activation and fault propagation. Fault activation establishes a signal value at the fault model site that is opposite of the value produced by the fault model. Fault propagation moves the resulting signal value, or fault effect, forward by sensitizing a path from the fault site to a primary output. If a fault is intrinsically undetectable, no test patterns may exist to detect that particular fault. For example, a redundant circuit is designed to avoid output changes caused by a single fault, and thus a single fault in the circuit may be inherently undetectable.

Design for testing (DFT) represents a circuit design technique that adds certain testability features to a circuit design. The premise of the added features is that they make it easier to develop and apply manufacturing tests for the designed circuit. The purpose of manufacturing tests is to validate that the circuit contains no manufacturing defects that could adversely affect the circuit's correct functioning. DFT plays an important role in the development of test programs and as an interface for test application and diagnostics. ATPG is much easier if appropriate DFT rules and suggestions have been implemented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
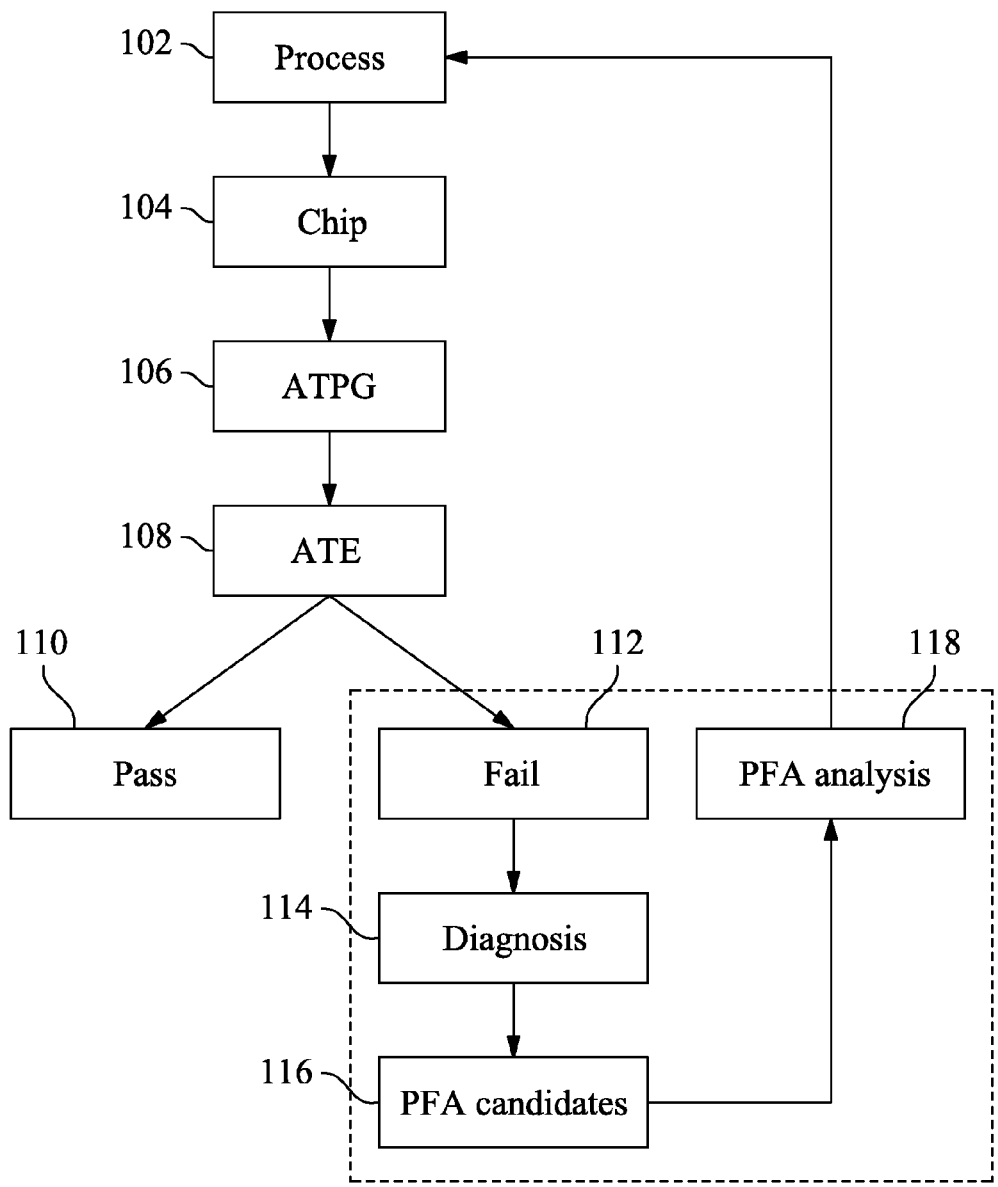
FIG. 1 depicts an example flow diagram of fault diagnosis, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
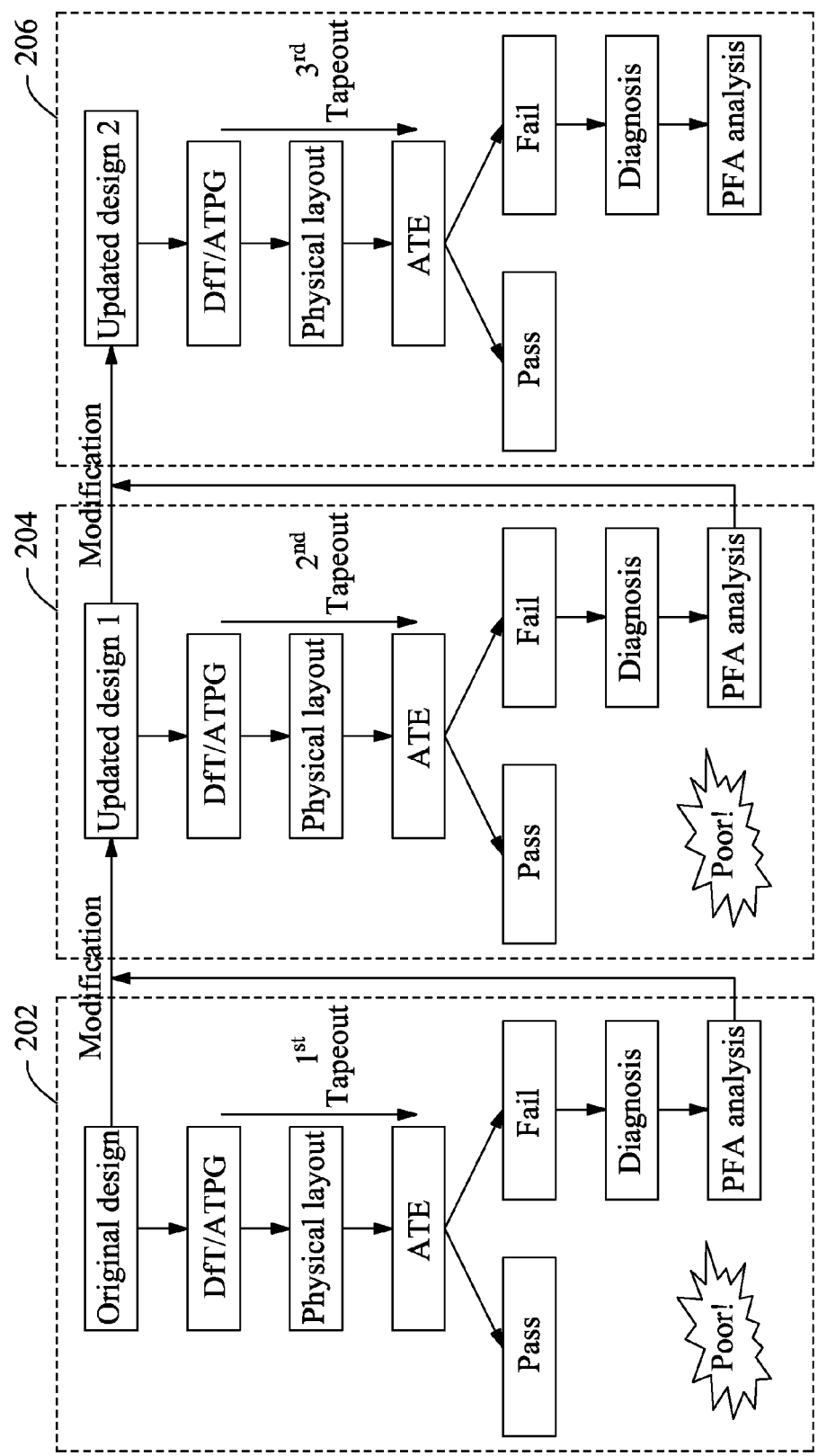
FIG. 2 depicts an example diagram of multiple design iterations, in accordance with some embodiments.

FIG. 1 depicts an example flow diagram of fault diagnosis, in accordance with some embodiments. As shown in FIG. 1, a manufacturing process 102 is carried out to generate a test chip 104 for a circuit design, and one or more test patterns are generated during an ATPG process 106 for the test chip 104. Automatic testing equipment performs a fault testing process 108 on the test chip 104 using the generated test patterns. At 110, if the test chip 104 passes the fault testing, the associated circuit design is determined to have passed the fault testing and considered fault free. At 112, if the test chip 104 fails the fault testing, that indicates the associated circuit design fails the fault testing and may contain manufacturing defects. At 114, fault diagnosis is performed to isolate defect locations and generate one or more PFA candidates 116. At 118, PFA analysis is carried out to detect the defects so that the either the circuit design can be modified to remove the detected defects or a manufacturing process can be improved for future use. As shown in FIG. 1, the fault diagnosis is performed after the test pattern generation, and thus there is no guarantee whether the test chip 104 is diagnosable or not. If the fault diagnosis results are not good, the PFA analysis could be of poor quality, which may lead to very few defects being detected from the PFA analysis. Then, multiple design iterations may be needed to detect systematic defects present in the manufacturing process, as shown in FIG. 2. As shown in FIG. 2, the first design iteration 202 results in the detection of $n_1$ defects, the second design iteration 204 results in the detection of $n_2$ defects, and the third design iteration 206 results in the detection of $n_3$ defects. Multiple design iterations may be time consuming and expensive, and it is difficult to determine the quality of diagnosis and necessary design changes before multiple test chips are manufactured.

Figure 3:
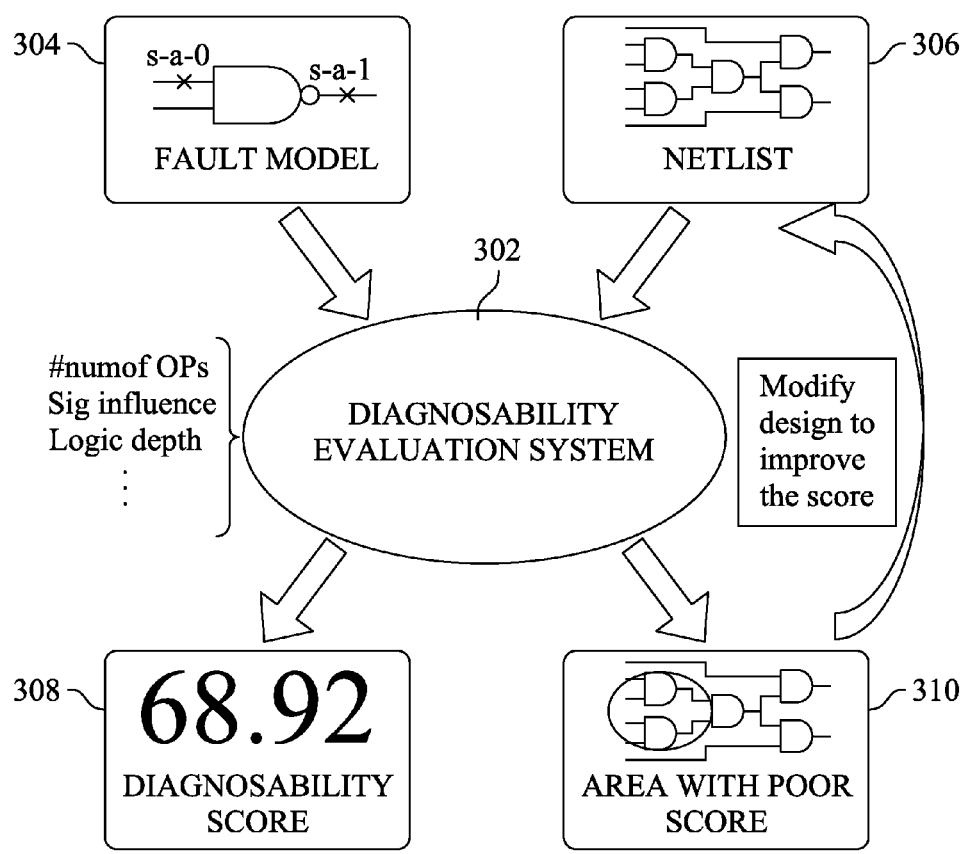
FIG. 3 depicts an example diagram of fault diagnosis, in accordance with some embodiments.

FIG. 3 depicts an example diagram of fault diagnosis, in accordance with some embodiments. As shown in FIG. 3, a diagnosability evaluation system 302 is implemented for fast and accurate fault analysis. As shown in FIG. 3, data related to one or more fault models 304 (e.g., stuck-at fault models, bridging fault models, transistor faults, open fault models, delay fault models, etc.) and data related to one or more netlists 306 associated with an original circuit design are provided to the diagnosability evaluation system 302. One or more diagnosability scores 308 (e.g., associated with one or more faults) are generated by the diagnosability evaluation system 302, e.g., before test patterns are determined. For example, a number of circuit areas 310 with poor diagnosability scores (e.g., below a preliminary threshold) are determined, and the circuit design is modified (e.g., to improve the circuit areas 310) for further diagnosability evaluation.

Figure 4:
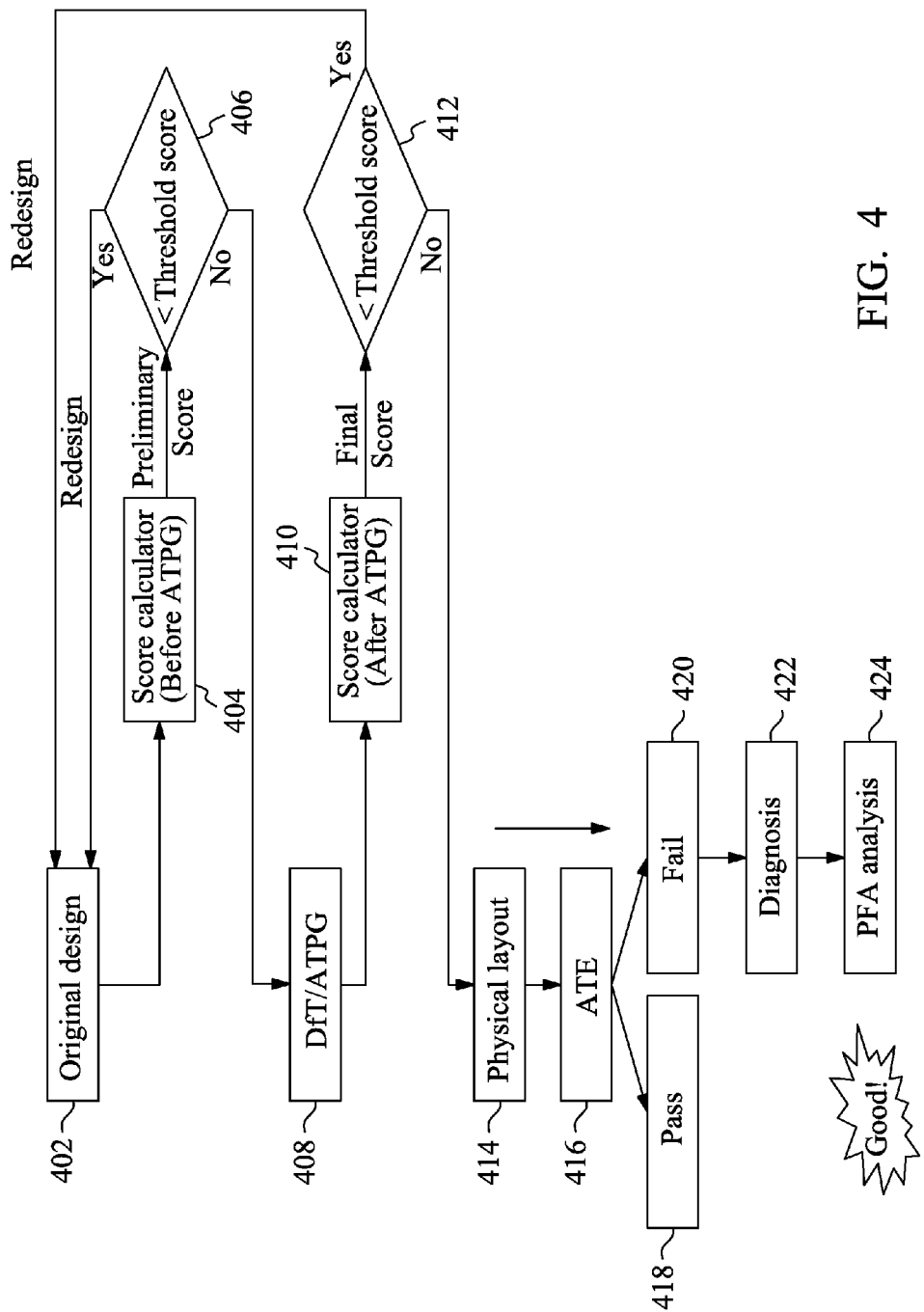
FIG. 4 depicts an example flow diagram of fault diagnosis, in accordance with some embodiments.

FIG. 4 depicts an example flow diagram of fault diagnosis, in accordance with some embodiments. As shown in FIG. 4, an original circuit design 402 is evaluated for diagnosability. A score calculator 404 calculates one or more preliminary scores for the original circuit design 402 (e.g., before an ATPG process). At 406, it is determined whether the preliminary scores are smaller than a preliminary threshold. If the preliminary scores are smaller than the preliminary threshold, the original circuit design goes through a redesign process to be modified, and the updated circuit design replaces the original circuit design as the input for the entire process. At 408, a DFT/ATPG process is carried out to generate a test pattern set (e.g., including one or more test patterns) when the preliminary scores are no smaller than the preliminary threshold. Another score calculator 410 calculates one or more final scores for the original circuit design 402. At 412, it is determined whether the final scores are smaller than a final threshold. If the final scores are smaller than the final threshold, the original circuit design 402 is modified and the updated circuit design replaces the original circuit design as the input for the entire process.

In some embodiments, at 414, a physical layout is generated based at least in part on the original circuit design 402. Automatic testing equipment 416 performs fault testing to determine whether the original circuit design 402 fails the testing. At 418, if the original circuit design 402 passes the fault testing, the original circuit design 402 is considered defect free and no further action is required. At 420, the original circuit design 402 fails the fault testing, and fault diagnosis 422 is performed to generate one or more PFA candidates. At 424, PFA analysis is carried out using the generated PFA candidates to detect one or more defects (e.g., m defects). In some embodiments, only one design iteration is performed for defect detection to reduce the processing time and reduce associated costs.

Figure 5:
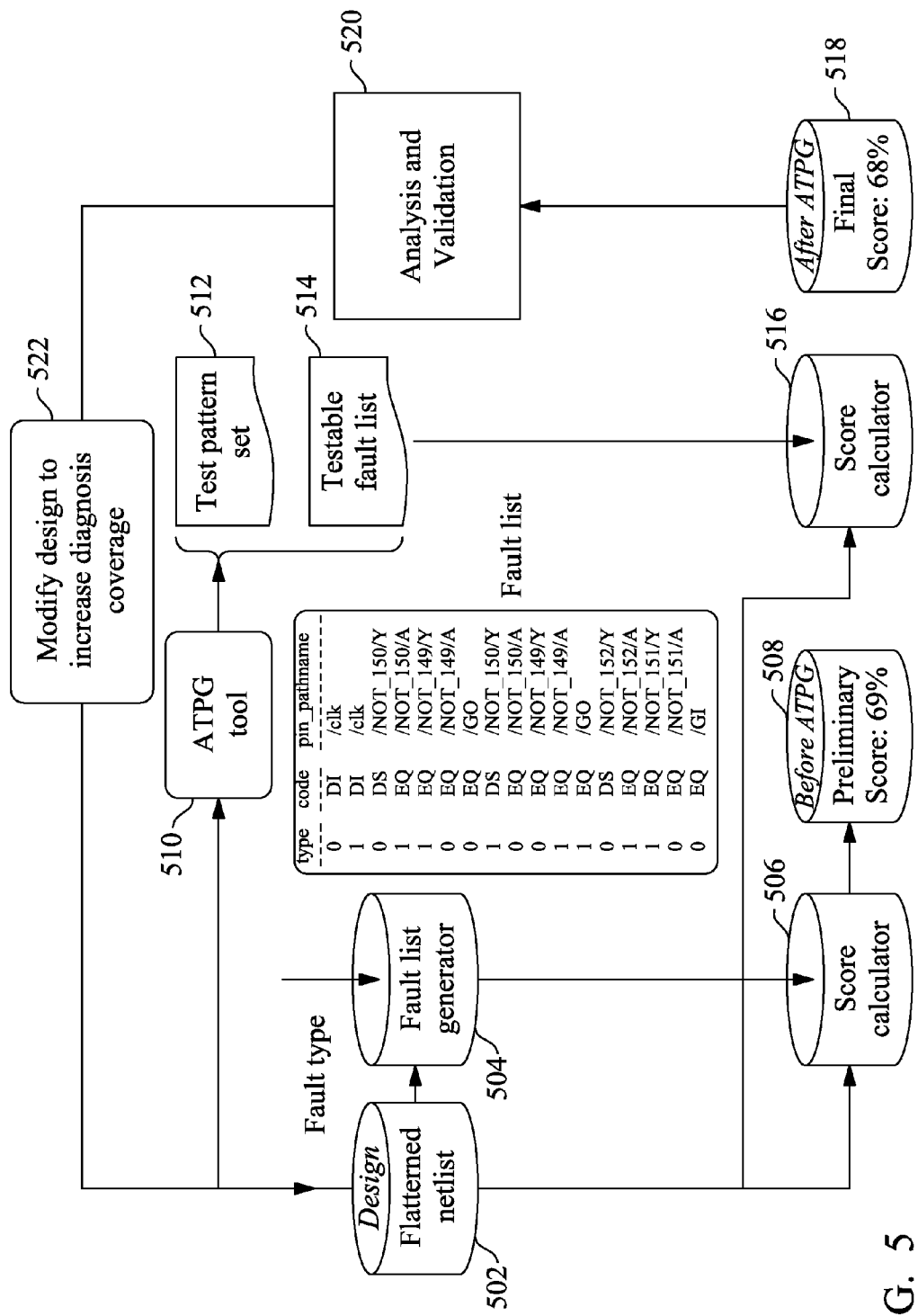
FIG. 5 depicts an example diagram of a fault diagnosis system, in accordance with certain embodiments.

FIG. 5 depicts an example diagram of a fault diagnosis system, in accordance with certain embodiments. As shown in FIG. 5, one or more flattened netlists 502 are generated based at least in part on an original circuit design. A fault list generator 504 determines a list of faults based at least in part on one or more fault types and the flattened netlists 502. A first score calculator 506 generates one or more preliminary scores 508 (e.g., representing fault distribution of the original circuit design) before an ATPG process. The preliminary scores 508 are used for determining whether the original circuit design needs to be modified to improve diagnosability.

An ATPG tool 510 is implemented to carry out the ATPG process and generate certain data including a test pattern set 512 and a list of testable faults 514. A second score calculator 516 calculates one or more final scores 518 (e.g., representing fault distribution of the entire original circuit design) based at least in part on the flattened netlists 502 and the data generated during the ATPG process. The final scores 518 are used to determine whether the original circuit design needs to be modified to improve the diagnosability of the entire circuit design. An analysis and validation process 520 is carried out to see if any further modification in the original circuit design is needed to improve the diagnosability of the entire circuit design. A modification process 522 is performed to modify the original circuit design, e.g., to increase diagnosis coverage.

As shown in FIG. 5, the first score calculator 506 and/or the second score calculator 516 implement one or more score models for calculating the one or more preliminary scores 508 and the one or more final scores 518 respectively. A weight (e.g., a binary weight) may be assigned to each fault (e.g., a structural untestable fault, an ATPG untestable fault, an ATPG testable fault, etc.). For example, before the ATPG process, each structural untestable fault is assigned a weight of 0, and all other faults are assigned a weight of 1. After the ATPG process, each structural untestable fault and each ATPG untestable fault are assigned a weight of 0, and all other faults are assigned a weight of 1.

Figure 6:
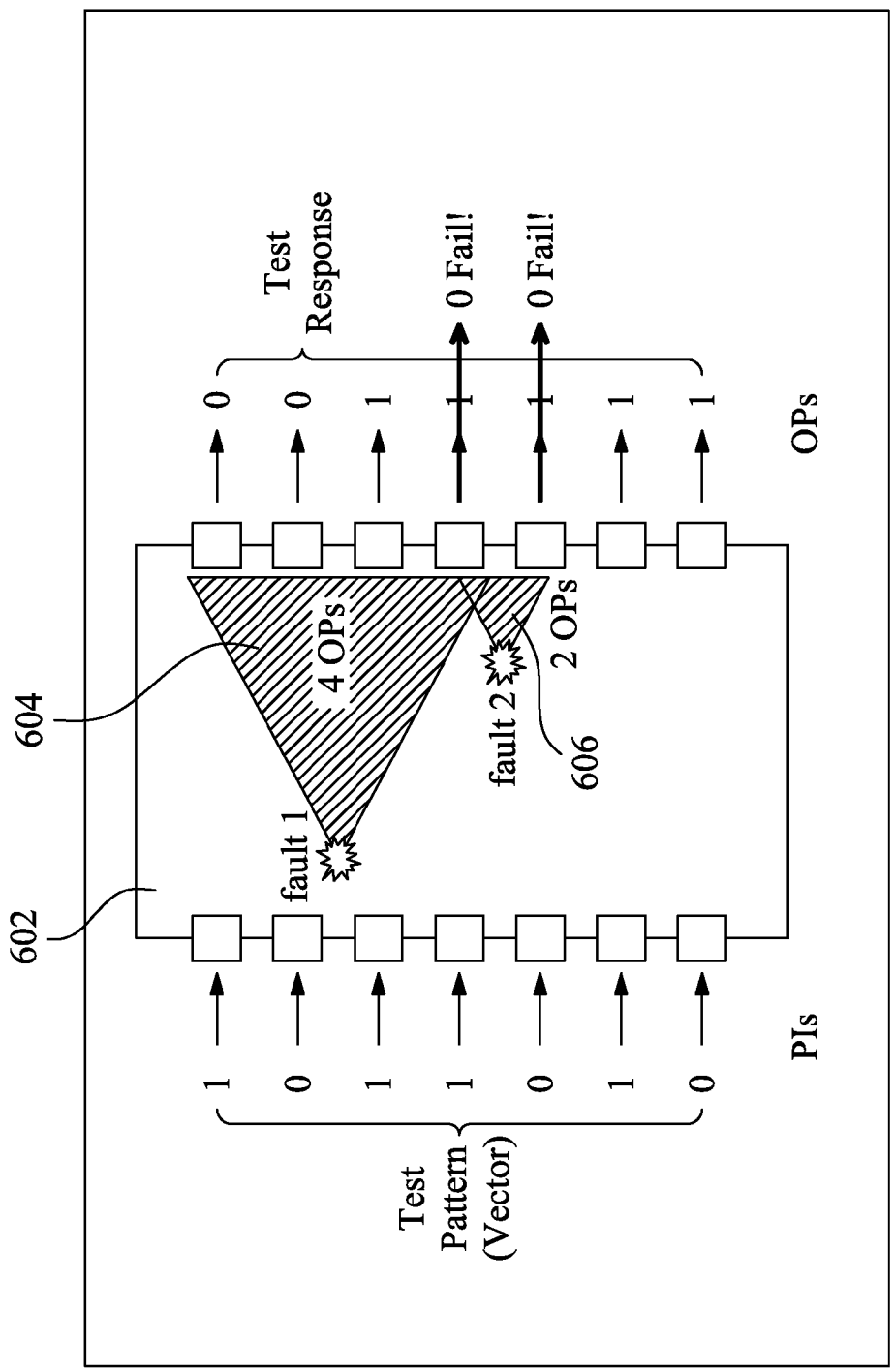
FIG. 6 depicts an example diagram of a digital circuit, in accordance with certain embodiments.

FIG. 6 depicts an example diagram of a digital circuit, in accordance with certain embodiments. As shown in FIG. 6, a test pattern (e.g., a vector of input signal values) is provided to primary inputs (PIs) of a digital circuit 602, and a test response (e.g., a group of output signal values) are obtained at various observation points (OPs). For example, the OPs include primary outputs of the digital circuit 602 and scan flip-flops (e.g., D-flip-flops). In some embodiments, more OPs lead to better diagnosability. A number of reachable OPs for each single fault may be obtained through forward tracing. As shown in FIG. 6, two fan-out cones 604 and 606 are used to obtain reachable OPs for fault 1 and fault 2 respectively.

In certain embodiments, the first score calculator 506 determines the one or more preliminary scores 508 according to the following equation:

$$S(i) = v_i \times \frac{M_i / N_{max}}{Eq_i} \qquad (1)$$

where S(i) represents a preliminary score associated with a fault i, $v_i$ represents a weight assigned to the fault i, $M_i$ represents a number of observation points for the fault i, $N_{max}$ represents a maximum number of observation points of all faults, and $Eq_i$ represents an equivalent number of faults for the fault i.

Figure 7:
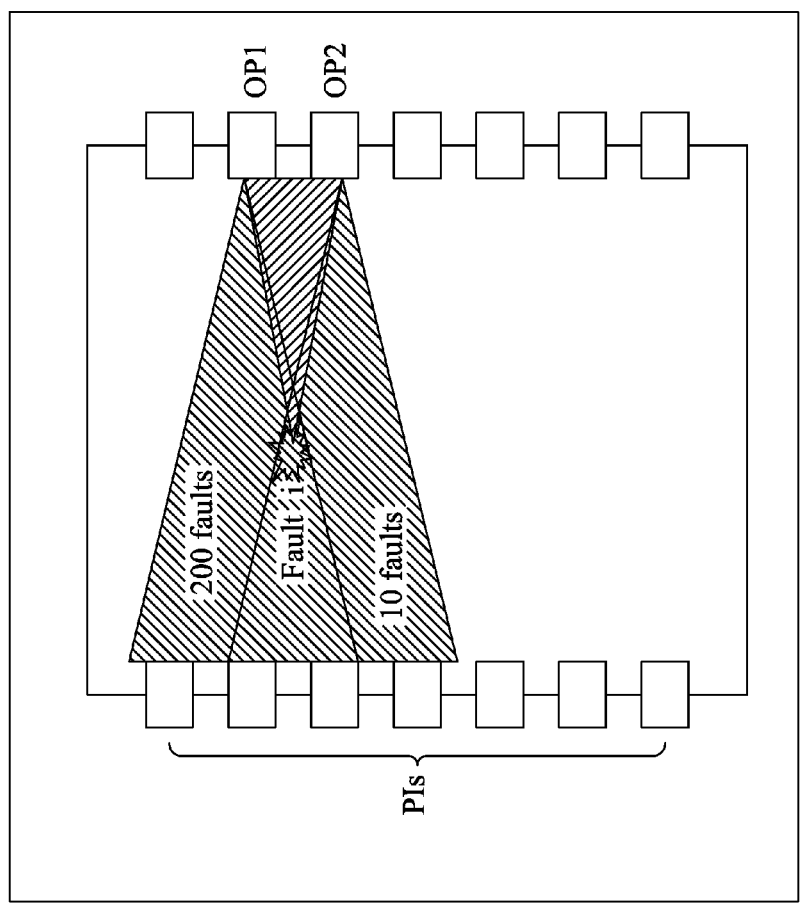
FIG. 7 depicts an example diagram of a digital circuit, in accordance with certain embodiments.

Fault congestion may decrease the effectiveness of an OP. FIG. 7 depicts an example diagram of a digital circuit, in accordance with certain embodiments. As shown in FIGS. 7, OP1 and OP2 represent two OPs of a fault i. Two hundred faults can propagate to OP1 while only ten faults can propagate to OP2. Then, OP2 is more effective then OP1 for the fault i.

In specific embodiments, each fault may be assigned a different weight based at least in part on the number of congestion faults and a signature associated with the fault. The first score calculator 506 determines the one or more preliminary scores 508 according to the following equation:

$$S(i) = v_i \times \frac{\sum_{j=1}^{M_i} \frac{1}{2N_{ij}} / N_{max}}{Eq_i} \qquad (2)$$

where S(i) represents a preliminary score associated with a fault i, $v_i$ represents a weight assigned to the fault i, $M_i$ represents a number of observation points for the fault i, $N_{max}$ represents a maximum number of observation points of all faults, $Eq_i$ represents an equivalent number of faults for the fault i, and $N_{ij}$ represents a number of nodes that can be propagated to an observation point j.

Figure 8:
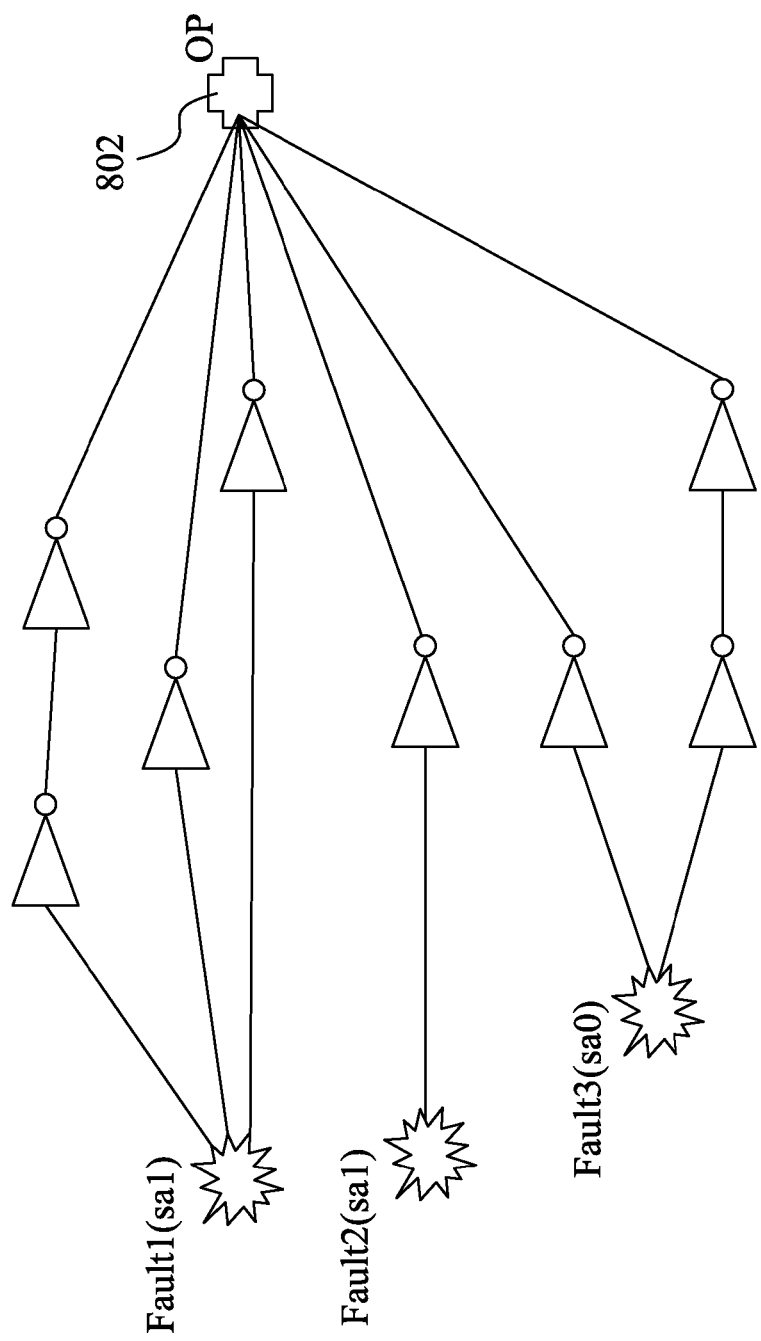
FIG. 8 depicts an example diagram showing paths to an observation point, in accordance with certain embodiments.

Faults having a same signature on one OP may influence the OP effectiveness. FIG. 8 depicts an example diagram showing paths to an observation point, in accordance with certain embodiments. As shown in FIG. 8, a signature of a fault on an OP 802 can be calculated by counting the number of inverters. For example, there are multiple paths from one fault to the OP 802. The signature of a fault can be either 1 or 0. Based on the number of paths of odd or even number of inverters, a probability of the signature being 1 or 0 can be calculated. As an example, as shown in FIG. 8, for Fault 1, the probability of the signature being 1 is equal to ⅓, and the probability of the signature being 0 is equal to ⅔. For Fault 2, the probability of the signature being 1 is equal to 0, and the probability of the signature being 0 is equal to 1. For Fault 3, the probability of the signature being 1 is equal to ½, and the probability of the signature being 0 is equal to ½. Thus, a score may be determined for each signature, and a preliminary score for Fault 1 is equal to a weighted sum of the score for the signature being 1 and the score for the signature being 0, where the probability of each signature is used as a weight for the signature.

In some embodiments, the first score calculator 506 determines the one or more preliminary scores 508 according to the following equation:

$$S(i) = v_i \times \frac{\left(\sum_{j=1}^{M_i} \frac{1}{2N_{ij} - Un_{ij}}\right) / N_{max}}{Eq_i} \qquad (3)$$

where S(i) represents a preliminary score associated with a fault i, $v_i$ represents a weight assigned to the fault i, $M_i$ represents a number of observation points for the fault i, $N_{max}$ represents a maximum number of observation points of all faults, $Eq_i$ represents an equivalent number of faults for the fault i, $N_{ij}$ represents a number of nodes that can be propagated to an observation point j, and $Un_{ij}$ represents a number of faults whose signatures are different from that of fault i on the observation point j.

Figure 9:
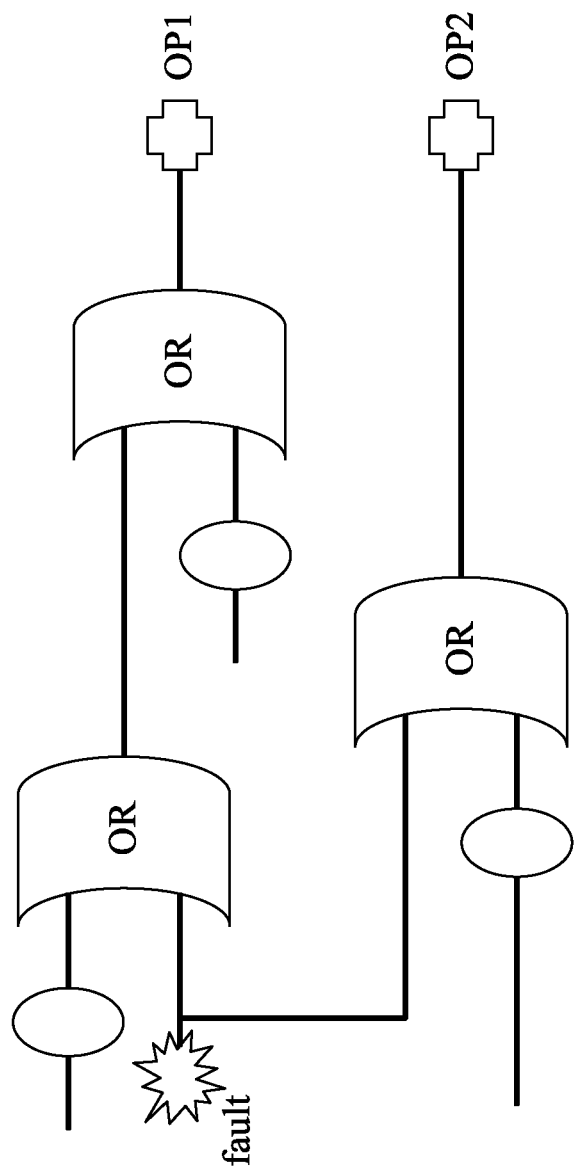
FIG. 9 depicts an example diagram showing logic distances associated with observation points, in accordance with certain embodiments.

If a logic distance between a fault location and an OP is small, the fault propagation may be less likely to be influenced (e.g., by a controlling value, other faults, etc.). A dynamic weight may be assigned for an OP j when a score is calculated for the fault i. FIG. 9 depicts an example diagram showing logic distances associated with observation points, in accordance with certain embodiments. As shown in FIG. 9, the logic distance associated with OP1 is determined to be 2, and the dynamic weight is determined to be ½. The logic distance associated with OP2 is determined to be 1, and the dynamic weight is determined to be 1.

In certain embodiments, the first score calculator 506 determines the one or more preliminary scores 508 according to the following equation:

$$S(i) = v_i \times \frac{\left(\sum_{j=1}^{M_i} \frac{1/L_{ij}}{2N_{ij} - Un_{ij}}\right) / N_{max}}{Eq_i} \qquad (4)$$

where S(i) represents a preliminary score associated with a fault i, $v_i$ represents a weight assigned to the fault i, $M_i$ represents a number of observation points for the fault i, $N_{max}$ represents a maximum number of observation points of all faults, $Eq_i$ represents an equivalent number of faults for the fault i, $N_{ij}$ represents a number of nodes that can be propagated to an observation point j, $Un_{ij}$ represents a number of faults whose signatures are different from that of fault i on the observation point j, and $L_{ij}$ represents a logic depth between fault i and the observation point j.

In specific embodiments, the second score calculator 516 determines the one or more final scores 518 under a best-case scenario according to the following equations:

$$S_{best}(i) = k \times \left( v_i \times \frac{\left(\left(\sum_{j=1}^{M_i} \left( P0_{ij} \times \frac{1/L_{ij}}{2N_{ij} - Un_{ij0best}} + P1_{ij} \times \frac{1/L_{ij}}{2N_{ij} - Un_{ij1best}} \right)\right) / N_{max} \right)}{Eq_i} \right) \qquad (5)$$

where $S_{best}(i)$ represents a best-case final score associated with a fault i, $v_i$ represents a weight assigned to the fault i, $M_i$ represents a number of observation points for the fault i, $N_{max}$ represents a maximum number of observation points of all faults, $Eq_i$ represents an equivalent number of faults for the fault i, $N_{ij}$ represents a number of nodes that can be propagated to an observation point j, $P0_{ij}$ represents a probability that the fault i has 0 signature on the observation point j, $Un_{ij0best}$ represents a number of faults whose signatures are different from that of fault i on the observation point j in a best-case scenario when the fault i has 0 signature on the observation point j, $L_{ij}$ represents a logic depth between fault i and the observation point j, $P1_{ij}$ represents a probability that fault i has 1 signature on the observation point j, $Un_{ij1best}$ represents a number of faults whose signatures are different from that of fault i on the observation point j in the best-case scenario when the fault i has 1 signature on the observation point j, and k represents a user-defined weight to customize a score range.

In other embodiments, the second score calculator 516 determines the one or more final scores 518 under a best-case scenario and a worst-case scenario according to the following equations:

$$S_{worst}(i) = k \times \left( v_i \times \frac{\left( \left[ \sum_{j=1}^{M_i} \left( P0_{ij} \times \frac{1/L_{ij}}{2N_{ij} - Un_{ij0worst}} + P1_{ij} \times \frac{1/L_{ij}}{2N_{ij} - Un_{ij1worst}} \right) \right] / N_{max} \right)}{Eq_i} \right) \quad (6)$$

where $S_{worst}(i)$ represents a worst-case final score associated with the fault i, $Un_{ij0worst}$ represents a number of faults whose signatures are different from that of fault i on the observation point j in a worst-case scenario when the fault i has 0 signature on the observation point j, and $Un_{ij1worst}$ represents a number of faults whose signatures are different from that of fault i on the observation point j in the worst-case scenario when the fault i has 1 signature on the observation point j.

Figure 10:
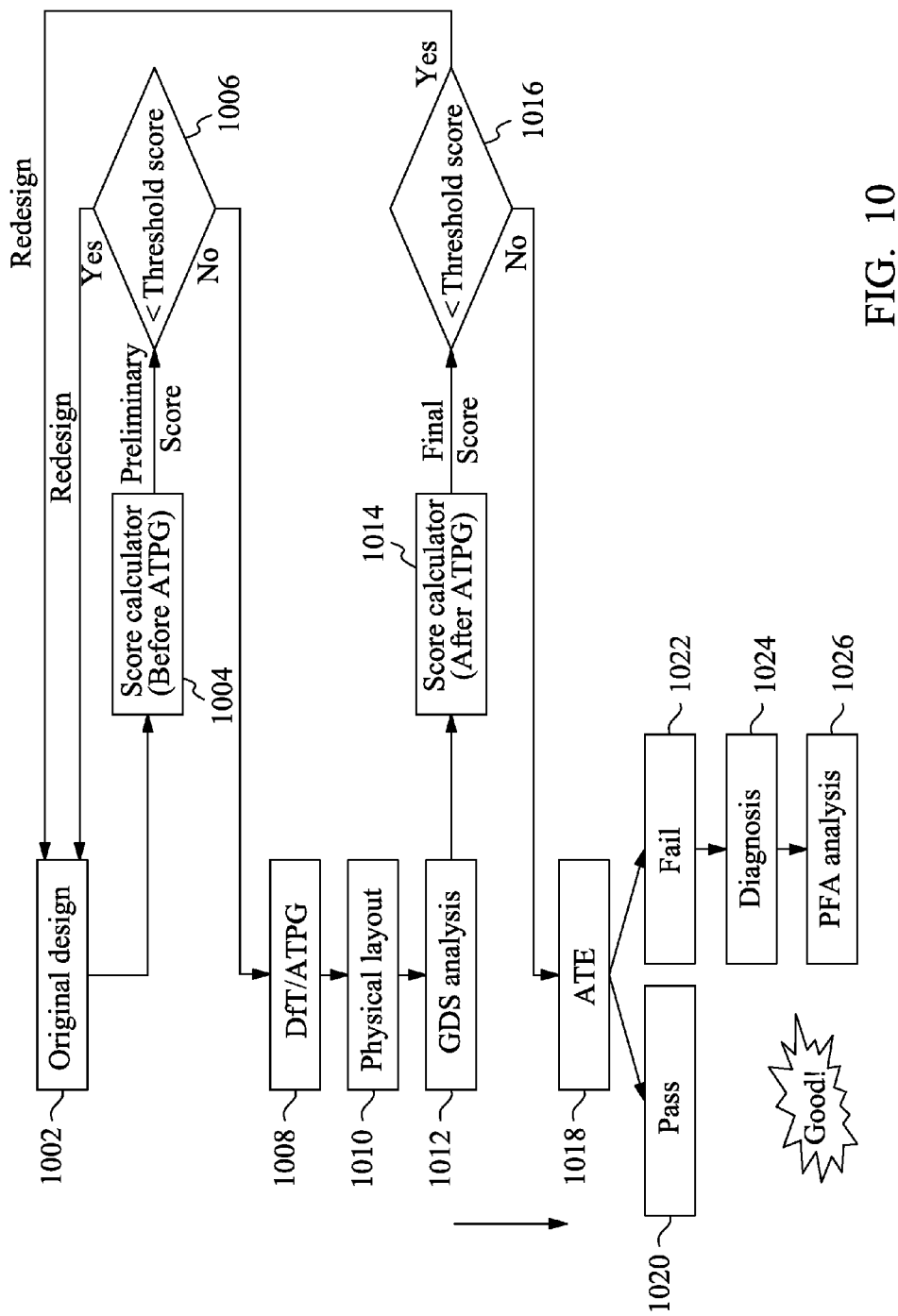
FIG. 10 depicts an example flow diagram of fault diagnosis, in accordance with certain embodiments.

FIG. 10 depicts an example flow diagram of fault diagnosis, in accordance with certain embodiments. As shown in FIG. 10, an original circuit design 1002 is evaluated for diagnosability. A score calculator 1004 calculates one or more preliminary scores for the original circuit design 1002 (e.g., before an ATPG process). At 1006, it is determined whether the preliminary scores are smaller than a preliminary threshold. If the preliminary scores are smaller than the preliminary threshold, the original circuit design 1002 is modified and the updated circuit design replaces the original circuit design as the input of the entire process. At 1008, a DFT/ATPG process is carried out to generate a test pattern set (e.g., including one or more test patterns) when the preliminary scores are no smaller than the preliminary threshold. At 1010, a physical layout is generated based at least in part on the original circuit design 1002. At 1012, location information of observation points (e.g., physical locations, distances, etc.) is extracted (e.g., through analyzing GDS files associated with the physical layout). Another score calculator 1014 calculates one or more final scores for the original circuit design 1002. At 1016, it is determined whether the final scores are smaller than a final threshold. If the final scores are smaller than the final threshold, the original circuit design 1002 is modified and the updated circuit design replaces the original circuit design 1002 as the input of the entire process.

Automatic testing equipment 1018 performs fault testing to determine whether the original circuit design 1002 fails the testing. At 1020, if the original circuit design 1002 passes the fault testing, the original circuit design 1002 is considered defect free. At 1022, the original circuit design 1002 fails the fault testing, and fault diagnosis 1024 is performed to generate one or more PFA candidates. At 1026, PFA analysis is carried out to detect one or more defects (e.g., m defects).

According to one embodiment, a method is provided for circuit fault diagnosis. An original circuit design is evaluated to determine whether the original circuit design is to be modified based at least in part on one or more first faults. In response to the original circuit design being determined not to be modified based at least in part on the one or more first faults, a first test pattern set is automatically generated based at least in part on the original circuit design. The original circuit design is evaluated to determine whether the original circuit design is to be modified based at least in part on the first test pattern set. In response to the original circuit design being determined not to be modified based at least in part on the first test pattern set, fault testing is performed to determine whether the original circuit design fails.

According to another embodiment, a system for circuit fault diagnosis includes: a preliminary evaluation component configured to evaluate the original circuit design to determine whether the original circuit design is to be modified based at least in part on one or more faults; a test pattern generator configured to, in response to the original circuit design being determined not to be modified based at least in part on the one or more faults, automatically generate a test pattern set based at least in part on the original circuit design; a final evaluation component configured to evaluate the original circuit design to determine whether the original circuit design is to be modified based at least in part on the test pattern set; and a testing component configured to, in response to the original circuit design being determined not to be modified based at least in part on the first test pattern set, perform fault testing to determine whether the original circuit design fails.

According to yet another embodiment, a processor-implemented system for fault diagnosis of an integrated circuit design includes: one or more non-transitory machine-readable storage media for storing a computer database having a database schema that includes and interrelates fault model fields, and netlist fields; the fault model fields storing model data of one or more fault models associated with an original circuit design; the netlist fields storing netlist data of one or more netlists associated with the original circuit design. The system further includes: one or more processors configured to: process a database query that operates over data related to the fault model fields, and data related to the netlist fields; determine one or more preliminary scores for one or more faults based at least in part on the data related to the fault model fields and the data related to the netlist fields; determine whether the original circuit design is to be modified based on the one or more preliminary scores; in response to the original circuit design being determined not to be modified based at least in part on the one or more preliminary scores, automatically generating a test pattern set based at least in part on the original circuit design; determine one or more final scores for the original circuit design based at least in part on the test pattern set; determine whether the original circuit design is to be modified based at least in part on the one or more final scores; and in response to the original circuit design being determined not to be modified based at least in part on the one or more final scores, perform fault testing to determine whether the original circuit design fails.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for circuit fault diagnosis, the method comprising:

evaluating, by one or more data processors, an original circuit design to determine whether the original circuit design is to be modified based at least in part on one or more preliminary scores for one or more first faults, wherein each preliminary score is based on a number of observation points for that fault and an equivalent number of faults for that fault;

in response to the original circuit design being determined not to be modified based at least in part on the one or more preliminary scores for the one or more first faults, automatically generating, by the one or more data processors, a first test pattern set based at least in part on the original circuit design;

evaluating, by the one or more data processors, the original circuit design to determine whether the original circuit design is to be modified based at least in part on the first test pattern set;

in response to the original circuit design being determined not to be modified based at least in part on the first test pattern set, physically performing fault testing by automated testing equipment on a first physical chip fabricated based on the original circuit design to determine whether the original circuit design fails; and in response to the original circuit design being determined to be modified based at least in part on the first test pattern set, physically performing fault testing by the automated testing equipment on a second physical chip fabricated based on a first updated circuit design to determine whether the first updated circuit design fails.

2. The method of claim 1, further comprising:
in response to the original circuit design being determined to be modified based at least in part on the one or more preliminary scores for the one or more first faults, modifying the original circuit design to generate a second updated circuit design;
evaluating the second updated circuit design to determine whether the second updated circuit design is to be modified based at least in part on one or more second faults;
in response to the second updated circuit design being determined not to be modified based at least in part on the one or more second faults, automatically generating a second test pattern set based at least in part on the second updated circuit design;
evaluating the second updated circuit design to determine whether the second updated circuit design is to be modified based at least in part on the second test pattern set; and
in response to the second updated circuit design being determined not to be modified based at least in part on the second test pattern set, performing physical fault testing by the automated testing equipment on a third physical chip to determine whether the second updated circuit design fails.

3. The method of claim 1, further comprising:
in response to the original circuit design being determined to be modified based at least in part on the first test pattern set, modifying the original circuit design to generate the first updated circuit design;
evaluating the first updated circuit design to determine whether the first updated circuit design is to be modified based at least in part on one or more second faults;
in response to the first updated circuit design being determined not to be modified based at least in part on the one or more second faults, automatically generating a second test pattern set based at least in part on the updated circuit design;
evaluating the first updated circuit design to determine whether the first updated circuit design is to be modified based at least in part on the second test pattern set; and
in response to the updated circuit design being determined not to be modified based at least in part on the second test pattern set, performing the physical fault testing by the automated testing equipment on the second physical chip fabricated based on the first updated circuit design to determine whether the first updated circuit design fails.

4. The method of claim 1, further comprising:
in response to the original circuit design being determined not to be modified based on the evaluating based at least in part on the first test pattern set, fabricating the first physical chip based on the original circuit design.

5. The method of claim 1, further comprising:
in response to the original circuit design being determined to be modified based on the evaluating based at least in part on the first test pattern set:
performing diagnosis on the original circuit design to generate one or more candidates for physical failure analysis; and
performing physical failure analysis based at least in part on the one or more candidates to determine one or more defects;
wherein the original circuit design is modified to generate the first updated circuit design based at least in part on the one or more defects.

6. The method of claim 1, wherein the evaluating the original circuit design to determine whether the original circuit design is to be modified based at least in part on the one or more first faults includes:
generating a flattened netlist based at least in part on the original circuit design;
generating the one or more first faults based at least in part on the flattened netlist;
generating the one or more preliminary scores based at least in part on the flattened netlist and the one or more first faults;
in response to the one or more preliminary scores being no smaller than a preliminary threshold, determining the original circuit design not to be modified; and
in response to the one or more preliminary scores being smaller than the preliminary threshold, determining the original circuit design to be modified.

7. The method of claim 6, wherein the generating the one or more preliminary scores based at least in part on the flattened netlist and the one or more first faults includes:
assigning one or more weights to the one or more first faults;
determining one or more observation points for each of the one or more first faults based at least in part on the original circuit design; and
calculating the one or more preliminary scores based at least in part on the one or more weights and the number of the one or more observation points.

8. The method of claim 7, wherein the one or more observation points include one or more primary outputs or one or more scan flip-flops.

9. The method of claim 7, wherein the one or more observation points for the one or more first faults are determined using forward tracing.

10. The method of claim 7, wherein the one or more preliminary scores are calculated according to the following equation:

$$S(i) = v_i \times \frac{M_i / N_{max}}{Eq_i}$$

where S(i) represents a preliminary score associated with a fault i, $v_i$ represents a weight assigned to the fault i, $M_i$ represents a number of observation points for the fault i, $N_{max}$ represents a maximum number of observation points of all faults, and $Eq_i$, represents an equivalent number of faults for the fault i.

11. The method of claim 7, wherein the one or more preliminary scores are calculated according to the following equation:

$$S(i) = v_i \times \frac{\sum_{j=1}^{M_i} \frac{1}{2N_{ij}} / N_{max}}{Eq_i}$$

where S(i) represents a preliminary score associated with a fault i, $v_i$ represents a weight assigned to the fault i, $M_i$ represents a number of observation points for the fault i, $N_{max}$ represents a maximum number of observation points of all faults, $Eq_i$, represents an equivalent number of faults for the fault i, and $N_{ij}$ represents a number of nodes that can be propagated to an observation point j.

12. The method of claim 7, wherein the one or more preliminary scores are calculated according to the following equation:

$$S(i) = v_i \times \frac{\left(\left(\sum_{j=1}^{M_i} \frac{1}{2N_{ij} - Un_{ij}}\right) / N_{max}\right)}{Eq_i}$$

where S(i) represents a preliminary score associated with a fault i, $v_i$ represents a weight assigned to the fault i, $M_i$ represents a number of observation points for the fault i, $N_{max}$ represents a maximum number of observation points of all faults, $Eq_i$, represents an equivalent number of faults for the fault i, $N_{ij}$ represents a number of nodes that can be propagated to an observation point j, and $Un_{ij}$ represents a number of faults whose signatures are different from that of fault i on the observation point j.

13. The method of claim 7, wherein the one or more preliminary scores are calculated according to the following equation:

$$S(i) = v_i \times \frac{\left(\left(\sum_{j=1}^{M_i} \frac{1/L_{ij}}{2N_{ij} - Un_{ij}}\right) / N_{max}\right)}{Eq_i}$$

where S(i) represents a preliminary score associated with a fault i, $v_i$ represents a weight assigned to the fault i, $M_i$ represents a number of observation points for the fault i, $N_{max}$ represents a maximum number of observation points of all faults, $Eq_i$, represents an equivalent number of faults for the fault i, $N_{ij}$ represents a number of nodes that can be propagated to an observation point j, $Un_{ij}$ represents a number of faults whose signatures are different from that of fault i on the observation point j, $L_{ij}$ represents a logic depth between fault i and the observation point j.

14. The method of claim 1, wherein the evaluating the original circuit design to determine whether the original circuit design is to be modified based at least in part on the first test pattern set includes:

determining one or more second faults;

generating one or more final scores based at least in part on a flattened netlist associated with the original circuit design, the first test pattern set and the one or more second faults;

in response to the one or more final scores being no smaller than a final threshold, determining the original circuit design not to be modified; and in response to the one or more final scores being smaller than the final threshold, determining the original circuit design to be modified.

15. The method of claim 14, wherein the generating the one or more final scores based at least in part on the flattened netlist associated with the original circuit design, the first test pattern set and the one or more second faults includes:

assigning one or more weights to the one or more second faults;

determining one or more observation points for the one or more second faults based at least in part on the original circuit design; and calculating the one or more final scores based at least in part on the one or more weights and the one or more observation points.

16. The method of claim 14, wherein the one or more final scores are calculated according to the following equations:

$$S_{best}(i) = k \times \left( v_i \times \frac{\left(\left(\sum_{j=1}^{M_i} \left(P0_{ij} \times \frac{1/L_{ij}}{2N_{ij} - Un_{ij0best}} + P1_{ij} \times \frac{1/L_{ij}}{2N_{ij} - Un_{ij1best}}\right)\right) / N_{max}\right)}{Eq_i} \right)$$

where $S_{best}(i)$ represents a best-case final score associated with a fault i, $v_i$ represents a weight assigned to the fault i, $M_i$ represents a number of observation points for the fault i, $N_{max}$ represents a maximum number of observation points of all faults, $Eq_i$ represents an equivalent number of faults for the fault i, $N_{ij}$ represents a number of nodes that can be propagated to an observation point j, $P0_{ij}$ represents a probability that the fault i has 0 signature on the observation point j, $Un_{ij0best}$ represents a number of faults whose signatures are different from that of fault i on the observation point j in a best-case scenario when the fault i has 0 signature on the observation point j, $L_{ij}$ represents a logic depth between fault i and the observation point j, $P1_{ij}$ represents a probability that fault i has 1 signature on the observation point j, $Un_{ij1best}$ represents a number of faults whose signatures are different from that of fault i on the observation point j in the best-case scenario when the fault i has 1 signature on the observation point j, and k represents a user-defined weight to customize a score range;

$$S_{worst}(i) = k \times \left( v_i \times \frac{\left[ \left( \sum_{j=1}^{M_i} \left( \begin{array}{c} P0_{ij} \times \frac{1/L_{ij}}{2N_{ij} - Un_{ij0worst}} + \\ P1_{ij} \times \frac{1/L_{ij}}{2N_{ij} - Un_{ij1worst}} \end{array} \right) \right) / N_{max} \right]}{Eq_i} \right)$$

where $S_{worst}(i)$ represents a worst-case final score associated with the fault i, $Un_{ij0worst}$ represents a number of faults whose signatures are different from that of fault i on the observation point j in a worst-case scenario when the fault i has 0 signature on the observation point j, and $Un_{ij1worst}$ represents a number of faults whose signatures are different from that of fault i on the observation point j in the worst-case scenario when the fault i has 1 signature on the observation point j.

17. The method of claim 1, further comprising:
generating a physical layout based at least in part on the original circuit design;
wherein the physical layout is generated after the original circuit design is evaluated based at least in part on the first test pattern set.

18. The method of claim 1, further comprising:
generating a physical layout based at least in part on the original circuit design; and
extracting location information associated with one or more observation points based at least in part on the physical layout;
wherein the evaluating the original circuit design to determine whether the original circuit design is to be modified based at least in part on the first test pattern set includes:
evaluating the original circuit design to determine whether the original circuit design is to be modified based at least in part on the first test pattern set and the location information associated with the one or more observation points.

19. A system for circuit fault diagnosis, the system comprising:
a preliminary evaluation component configured to evaluate the original circuit design to determine whether the original circuit design is to be modified based at least in part on one or more preliminary scores for one or more faults, wherein each preliminary score is based on a number of observation points for that fault and an equivalent number of faults for that fault;
a test pattern generator configured to, in response to the original circuit design being determined not to be modified based at least in part on the one or more preliminary scores for the one or more faults, automatically generate a test pattern set based at least in part on the original circuit design;
a final evaluation component configured to evaluate the original circuit design to determine whether the original circuit design is to be modified based at least in part on the test pattern set; and
automated testing equipment configured to, in response to the original circuit design being determined not to be modified based at least in part on the first test pattern set, physically perform fault testing on a first physical chip fabricated based on the original circuit design to determine whether the original circuit design fails,
the automated testing equipment further being configured to, in response to the original circuit design being determined to be modified based at least in part on the test pattern set, physically perform fault testing on a second physical chip fabricated based on an updated circuit design to determine whether the updated circuit design fails.

20. A system for fault diagnosis of an integrated circuit design, the system comprising:
one or more non-transitory machine-readable storage media for storing a computer database having a database schema that includes and interrelates fault model fields, and netlist fields;
the fault model fields storing model data of one or more fault models associated with an original circuit design;
the netlist fields storing netlist data of one or more netlists associated with the original circuit design; and
one or more processors configured to:
process a database query that operates over data related to the fault model fields, and data related to the netlist fields;
determine one or more preliminary scores for one or more faults based at least in part on the data related to the fault model fields and the data related to the netlist fields, wherein each preliminary score is based on a number of observation points for that fault and an equivalent number of faults for that fault;
determine whether the original circuit design is to be modified based on the one or more preliminary scores;
in response to the original circuit design being determined not to be modified based at least in part on the one or more preliminary scores, automatically generating a test pattern set based at least in part on the original circuit design;
determine one or more final scores for the original circuit design based at least in part on the test pattern set;
determine whether the original circuit design is to be modified based at least in part on the one or more final scores; and
automated testing equipment configured to, in response to the original circuit design being determined not to be modified based at least in part on the one or more final scores, physically perform fault testing on a first physical chip fabricated based on the original circuit design to determine whether the original circuit design fails,
the automated testing equipment further being configured to, in response to the original circuit design being determined to be modified based at least in part on the one or more final scores, physically perform fault testing on a second physical chip fabricated based on an updated circuit design to determine whether the updated circuit design fails.

* * * * *